(12) United States Patent
Hell et al.

(10) Patent No.: US 10,957,768 B1
(45) Date of Patent: Mar. 23, 2021

(54) SILICON CARBIDE DEVICE WITH AN IMPLANTATION TAIL COMPENSATION REGION

(71) Applicant: Infineon Technologies AG, Neubiberg (DE)

(72) Inventors: Michael Hell, Erlangen (DE); Rudolf Elpelt, Erlangen (DE); Caspar Leendertz, Munich (DE); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/595,375

(22) Filed: Oct. 7, 2019

(51) Int. Cl.
| | |
|---|---|
| *H01L 29/66* | (2006.01) |
| *H01L 29/167* | (2006.01) |
| *H01L 29/78* | (2006.01) |
| *H01L 29/16* | (2006.01) |

(52) U.S. Cl.
CPC ........ *H01L 29/167* (2013.01); *H01L 29/1608* (2013.01); *H01L 29/66712* (2013.01); *H01L 29/7802* (2013.01)

(58) Field of Classification Search
CPC ............... H01L 29/167; H01L 29/1608; H01L 29/66712; H01L 29/7802
See application file for complete search history.

(56) References Cited

U.S. PATENT DOCUMENTS

| | | | |
|---|---|---|---|
| 6,297,100 B1 | 10/2001 | Kumar et al. | |
| 2005/0280004 A1 | 12/2005 | Das et al. | |
| 2009/0090920 A1 | 4/2009 | Endo et al. | |
| 2014/0113421 A1 | 4/2014 | Harada et al. | |
| 2016/0056266 A1* | 2/2016 | Nakamura | H01L 21/02378 |
| | | | 438/156 |
| 2017/0229541 A1 | 8/2017 | Nakamura et al. | |

FOREIGN PATENT DOCUMENTS

| | | |
|---|---|---|
| DE | 10303232 A1 | 8/2003 |
| EP | 1814162 A1 | 8/2007 |
| EP | 1313147 A3 | 1/2008 |

* cited by examiner

*Primary Examiner* — Thomas L Dickey
(74) *Attorney, Agent, or Firm* — Murphy, Bilak & Homiller, PLLC (57) ABSTRACT

A SiC substrate of a semiconductor device includes: a drift region of a first conductivity type; a body region of a second conductivity type having a channel region which adjoins a first surface of the SiC substrate; a source region of the first conductivity type adjoining a first end of the channel region; an extension region of the first conductivity type at an opposite side of the body region as the source region and vertically extending to the drift region; a buried region of the second conductivity type below the body region and having a tail which extends toward the first surface and adjoins the extension region; and a compensation region of the first conductivity type protruding from the extension region into the body region along the first surface and terminating at a second end of the channel region opposite the first end.

20 Claims, 6 Drawing Sheets

SILICON CARBIDE DEVICE WITH AN IMPLANTATION TAIL COMPENSATION REGION

BACKGROUND

Doping of silicon (Si) devices can be easily realized by both implantation and diffusion. Doping of silicon carbide (SiC) devices can be easily realized only by implantation, except for diffusion of boron. This poses challenges for achieving smooth implantation profiles in SiC devices, and leads to peak-like structures of doping profiles into the depth of SiC devices and also mask edge effects. For example, at mask edges, deep implantations lead to an implantation tail reaching up to the surface of the SiC substrate. The implantation tail affects doping profiles close to the surface.

For example, in a planar SiC MOSFET (metal-oxide-semiconductor field-effect transistor) structure, mask edge effects have an unwanted effect on channel doping. In power MOSFETs particularly, the gate oxide is shielded against electric fields for large source-drain voltages by a p-type buried region formed below the channel/body region. Since the implants to form both the p-type buried region and the channel/body region typically use the same mask, the p-type buried region often has an implantation tail which adjoins the end of the channel on the drain side of the device. Since the edge angle of the implantation mask changes due to process variation, the doping of the p-type implantation tail changes. This affects the inversion condition for the voltage-controlled channel and thus the threshold voltage for turn-on. In this way, process variations of the mask angle lead to strong variations of the threshold voltage and thus variations in specific on-resistance (RonA).

Other adverse effects on device performance or lifetime, such as large drain-induced barrier lowering (DIBL), may also be worsened by such mask edge effects. In some cases, DIBL is a limiting factor for the design of planar MOSFETs. Among other effects, DIBL negatively impacts the short circuit time of the device.

Thus, there is a need for an improved SiC device and methods of manufacturing thereof.

SUMMARY

According to an embodiment of a semiconductor device, the semiconductor device comprises a silicon carbide (SiC) substrate which comprises: a drift region of a first conductivity type; a body region of a second conductivity type above the drift region and having a channel region which adjoins a first surface of the SiC substrate; a source region of the first conductivity type in the body region and adjoining a first end of the channel region; an extension region of the first conductivity type at an opposite side of the body region as the source region and vertically extending from the first surface to the drift region; a buried region of the second conductivity type below the body region and having a tail which extends toward the first surface and adjoins the extension region; and a compensation region of the first conductivity type protruding from the extension region into the body region along the first surface and terminating at a second end of the channel region opposite the first end, the compensation region overcompensating the tail of the buried region so that the tail is separated from the second end of the channel region.

According to an embodiment of a method of producing a semiconductor device, the method comprises: forming a drift region of a first conductivity type in a silicon carbide (SiC) substrate; forming a body region of a second conductivity type above the drift region and having a channel region which adjoins a first surface of the SiC substrate; forming a source region of the first conductivity type in the body region and adjoining a first end of the channel region; forming an extension region of the first conductivity type at an opposite side of the body region as the source region and vertically extending from the first surface to the drift region; forming a buried region of the second conductivity type below the body region, the buried region having a tail which extends toward the first surface and adjoins the extension region; and forming a compensation region of the first conductivity type protruding from the extension region into the body region along the first surface and terminating at a second end of the channel region opposite the first end, the compensation region overcompensating the tail of the buried region so that the tail is separated from the second end of the channel region.

According to an embodiment of a silicon carbide (SiC) device, the SiC device comprises: a drift region of a first conductivity type; a body region of a second conductivity type above the drift region and having a channel region; a source region of the first conductivity type in the body region and adjoining a first end of the channel region; a buried region of the second conductivity type below the body region and having a tail which extends upward toward the channel region; and a compensation region of the first conductivity type adjoining a second end of the channel region opposite the first end. The buried region extends under the compensation region. An average doping concentration of the compensation region is greater than an average doping concentration of the tail of the buried region, so that the compensation region overcompensates the tail of the buried region and separates the tail from the second end of the channel region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a SiC device having a buried region for shielding the gate dielectric of the device against high electric fields and a compensation region for overcompensating an implantation tail of the buried region (also referred to as tail of the buried region in the following), and methods of manufacturing such a SiC device. The compensation region is of the opposite conductivity type as the buried (shielding) region, and has a doping concentration sufficient for overcompensating the tail of the buried region. As used herein, the term "overcompensating" means outnumbering dopant impurities of one conductivity type with dopant impurities of the opposite conductivity type in the same region of the SiC device. For example, an initially p-type semiconductor region becomes at least weakly n-type when overcompensated. Likewise, an initially n-type semiconductor region becomes at least weakly p-type when overcompensated. By overcompensating the tail of the buried region in the manner described herein, the tail is separated from the channel region of the device by a region having the opposite conductivity type as the buried region. This way, the SiC device may be less susceptible to adverse effects associated with the edge angle of the implantation mask used to form the buried region.

Figure 1:
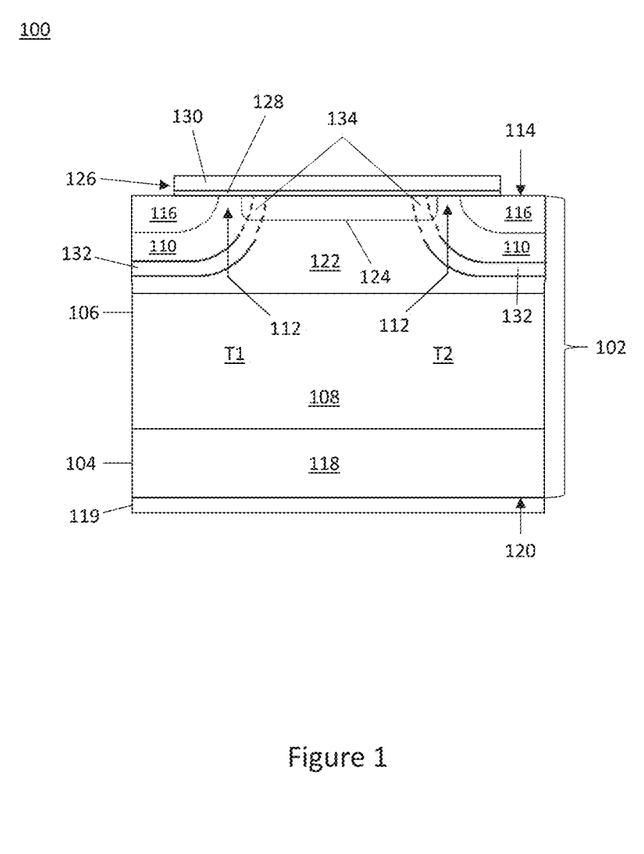
FIG. 1 illustrates a partial cross-sectional view of an embodiment of a SiC device having a buried region for shielding the gate dielectric of the device against high electric fields and a compensation region for overcompensating an implantation tail of the buried region.

FIG. 1 illustrates a partial cross-sectional view of two adjacent transistor cells T1, T2 of a semiconductor device 100. The semiconductor device 100 may include tens, hundreds, thousands or even more of such transistor cells. The semiconductor device 100 includes a silicon carbide (SiC) substrate 102. The SiC substrate 102 may include a SiC base 104 such as a SiC growth substrate or an epitaxial layer and one or more epitaxial layers 106 grown on the SiC base 104. A drift region 108 of a first conductivity type is formed in the SiC substrate 102 and shared by the transistor cells T1, T2.

Each transistor cell T1, T2 includes a body region 110 of a second conductivity type opposite the first conductivity type formed in the SiC substrate 102 above the drift region 108. The body region 110 has a channel region 112 which adjoins a first surface 114 of the SiC substrate 102. A source region 116 of the first conductivity type is formed in the body region 110 and adjoins a first end of the channel region 112.

A drain region 118 of the first conductivity type is formed in the SiC substrate 102 below the drift region 108. The drain region 118 adjoins a drain contact 119 at a second surface 120 of the SiC substrate 102 opposite the first surface 114.

An extension region 122 of the first conductivity type is formed at the opposite side of the body region 110 as the source region 116. The extension region 122 vertically extends to the drift region 108. The extension region 122 provides a conducting path between the drift region 108 and a compensation region 124 of the first conductivity type formed in the SiC substrate 102. The compensation region 124 laterally protrudes from the extension region 122 into the body region 110 along the first surface 114 of the SiC substrate 102. According to the embodiment illustrated in FIG. 1, the compensation region 124 extends uninterrupted along the first surface 114 of the SiC substrate 102 between the body regions 110 of the adjacent transistor cells T1, T2.

The SiC device 100 also includes an insulated gate 126 formed on the first surface 114 of the SiC substrate 102 for controlling the conducting state of the channel region 112 of each transistor cell T1, T2. According to this embodiment, the SiC device 100 is a planar gate device and the insulated gate 126 includes a gate dielectric 128 and a gate electrode 130. The gate dielectric 128 separates the gate electrode 130 from the first surface 114 of the SiC substrate 102. The conducting state of the channel region 112 of each transistor cell T1, T2 is controlled by applying a voltage between the gate electrode 130 and the corresponding source region 116. The compensation region 124 may laterally extend further along the insulated gate 126 toward the source region 116 than the extension region 122, for example, having the form of a peninsula or an elongated structure.

Each transistor cell T1, T2 also includes a buried region 132 of the second conductivity type formed in the SiC substrate 102 below the body region 110, and with the extension region 122 forms a pn-JFET (junction field-effect transistor). The buried region 132 shields the gate dielectric 128 against high electric fields for large source-drain voltages. Due to the imperfect nature of lithographic and etching processes employed in the manufacture of semiconductor devices, the mask (not shown) used to implant the buried (shielding) region 132 of each transistor cell T1, T2 has a sloped (angled) sidewall. The resulting buried region 132 therefore has an implantation tail 134 which extends toward the first surface 114 of the SiC substrate 102, since the implantation mask does not have full blocking capability in this region. The tail 134 of the buried region 132 adjoins the extension region 122 of the first conductivity type formed at the opposite side of the body region 110 as the source region 116. The tail 134 of each buried region 132 is represented by a respective set of dashed lines in FIG. 1.

The compensation region 124 terminates at a second end of the channel region 112 opposite the source region 116, and is provided for overcompensating the tail 134 of the buried region 132 so that the tail 134 is separated from the second end of the channel region 112. At least the upper part of the tail 134 closest to the first surface 114 of the SiC substrate 102 is overcompensated by the compensation region 124, meaning that the initial conductivity type of at least the upper part of the tail 134 has been overcome by the opposite conductivity type due to the presence of the compensation region 124. In other words, if not for the presence of the compensation region 124, the second end of the channel region 112 opposite the source region 116 would adjoin a region of the second conductivity type instead of the first conductivity type.

In the case of an n-channel SiC device, the first conductivity type is n-type and the second conductivity type is p-type. Conversely, the first conductivity type is p-type and the second conductivity type is n-type in the case of a p-channel SiC device. For an n-channel SiC device, at least the upper part of the tail 134 which was initially p-type is overcompensated by the compensation region 124 and therefore is now n-type. For a p-channel SiC device, at least the upper part of the tail 134 which was initially n-type is overcompensated by the compensation region 124 and therefore is now p-type.

In both (n- and p-channel) types of SiC devices, the compensation region 124 separates the tail 134 of the buried region 132 from the end of the channel region 112 opposite the source region 116 and forms a lateral connection between the channel region 112 and the extension region 122. This way, the SiC device 100 is less susceptible to adverse effects associated with the edge/sidewall angle of the implantation mask used to form the buried region 132 of each transistor cell T1, T2.

For example, by including the compensation region 124 in the SiC device 100, the tail 134 of the buried region 132 has little or no effect on the channel region 112 and thus threshold voltage. By providing the compensation region 124, the buried region 132 is effectively extended to accommodate the lateral space for the resulting nose. Such an extended buried region 132 can shield the end of the channel region 112 opposite the source region 116 more effectively against the electric field induced by the drain potential. This may lead to lower DIBL. In addition, the compensation region 124 extends the length of the p-n JFET junction region formed between the buried region 132 and the extension region 122, thereby reducing saturation current. Even without the implantation tail 134, reduced saturation current results due to the extended JFET region enabled by the compensation region 124.

The compensation region 124 may have a shallower average depth in the SiC substrate 102 than both the source region 116 and the body region 110 as measured from the first surface 114 of the SiC substrate 102.

Separately or in combination, the compensation region 124 may have a larger doping concentration than the extension region 122. In general, throughout this application, if the doping concentrations of two regions (e.g., the compensation region 124 and the extension region 122) are compared, this comparison may refer to only a non-overlapping part of the two regions if said two regions partially overlap. For example, the net doping concentration of the compensation region 124 may be in a range of about $3e16$ $cm^{-3}$ to about $3e17$ $cm^{-3}$ and the net doping concentration of the extension region 122 may be in a range of about $3e16$ $cm^{-3}$ to about $1e17$ $cm^{-3}$ in a non-overlapping part of the two regions 122, 124.

Separately or in combination, the compensation region 124 may have a slightly lower net doping concentration as the body region 110 at the first surface 114 of the SiC substrate 102 where the channel region 112 is formed. For example, the compensation region 124 and the channel region 112 may each have a net doping concentration in a range of about $3$ $e16$ $cm^{-3}$ to about $3$ $e17$ $cm^{-3}$.

Separately or in combination, the compensation region 124 may have a net doping concentration which is about a factor of about 10 lower than the net doping concentration of the buried (shielding) region 132. For example, the compensation region 124 may have a net doping concentration in a range of about $3e16$ $cm^{-3}$ to about $3e17$ $cm^{-3}$ and the buried region 132 may have a net doping concentration of about $3e18$ $cm^{-3}$.

Separately or in combination, the compensation region 124 may have a net doping concentration which is much lower than the net doping concentration of the source region 116. For example, the compensation region 124 may have a net doping concentration in a range of about $3e16$ $cm^{-3}$ to about $3e17$ $cm^{-3}$ and the source region 116 may have a net doping concentration of about $2e19$ $cm^{-3}$. The doping concentration examples provided above may vary in a window around these values.

FIGS. 2A through 2F illustrate respective simplified partial cross-sectional views of one transistor cell with the compensation region 124 during different stages of producing the semiconductor device 100 shown in FIG. 1.

Figure 2A:
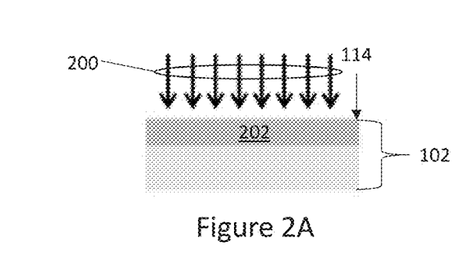
FIGS. 2A through 2F illustrate respective partial cross-sectional views of one transistor cell with the compensation region during different stages of producing the SiC device shown in FIG. 1.

FIG. 2A shows the SiC substrate 102 during blanket implanting 200 of dopants of the first conductivity type into the first surface 114 of the SiC substrate 102 to define a doping profile 202 of the compensation region 124. The dose of the blanket implant 200 is chosen so that the doping profile 202 yields an average doping concentration for the compensation region 124 which is greater than the average doping concentration of the tail 134 of the buried region 132 which is to be subsequently formed. If the average doping concentration of the compensation region 124 is too low, the resistance of the device in this region may be too large and worst case the compensation region 124 cannot overcompensate the tail 134 of the buried region 132. If the average doping concentration of the compensation region 124 is too high, the electric field increases which may cause a reliability problem for the gate dielectric 128. The minimum doping of the compensation region 124 depends on several factors, including the dose of the buried region implantation, the energy of the buried region implantation, and the angle ($\alpha$) of the edge/sidewall 216 of the mask 204 used during the buried region implantation. If the angle $\alpha$ between the edge/sidewall 216 of the buried region implantation mask 204 and the implantation direction is large, the resulting tail 134 will be very pronounced and a higher implantation dose is used to form the compensation region 124. Conversely, if the angle $\alpha$ between the edge/sidewall 216 of the buried region implantation mask 204 and the implantation direction is small (e.g. close to 0 degrees) and/or the edge/sidewall 216 of the buried region implantation mask 204 is nearly perpendicular to the first surface 114 of the SiC substrate 102 (e.g. close to 90 degrees), the resulting tail 134 is barely present and the dose for the compensation region 124 may be reduced accordingly.

Figure 2B:
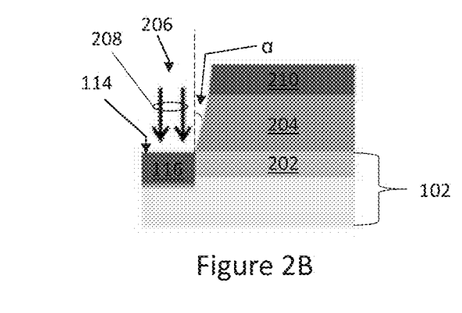

After the blanket implanting 200, a mask 204 is formed on the first surface 114 of the SiC substrate 102 as shown in FIG. 2B. The mask 204 has an opening 206 which defines a location for the source region 116. In one embodiment, the mask 204 is an oxide hard mask and the opening 206 is etched through the oxide hard mask 204 using a polysilicon mask 210. The source region 116 is formed by implanting 208 of dopants of the first conductivity type into the first surface 114 of the SiC substrate 102 through the opening 206 in the mask 204.

Figure 2C:
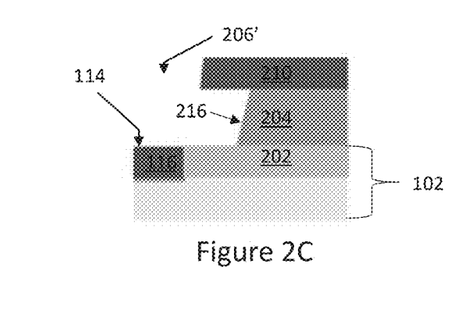

After forming the source region 116, the opening 206 in the mask 204 is widened to define a location for the body region 110 as shown in FIG. 2C. Alternatively, a new mask (not shown) with an opening that defines the location for the body region 110 may be formed on the first surface 114 of the SiC substrate 102.

Figures 2D, 2E:
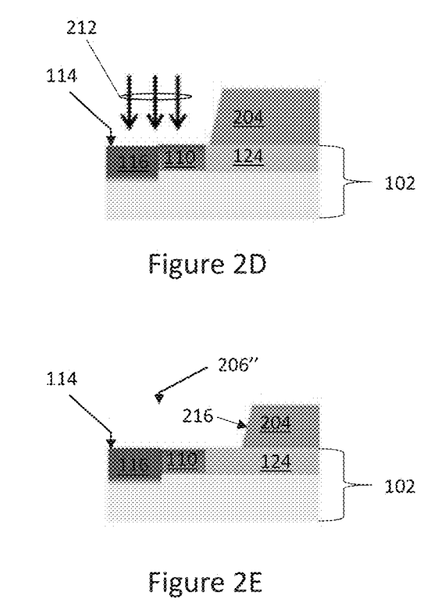

In either case, the body region 110 is then formed by implanting 212 of dopants of the second conductivity type into the first surface 114 of the SiC substrate 102 through the widened opening 206' in the mask 204 as shown in FIG. 2D or through the opening in the new mask (not shown). The body region 110 has a slightly higher or roughly the same magnitude net doping concentration as the doping profile 202 for the compensation region 124 at the first surface 114 of the SiC substrate 102 where the channel region 112 is formed, to define the border/edge between the compensation region 124 and the channel region 112.

After forming the body region 110, the opening 206' in the mask 204 is widened again to define a location for the buried (shielding) region 132 as shown in FIG. 2E. Alternatively, a new mask with an opening that defines the location for the buried region 132 may be formed on the first surface 114 of the SiC substrate 102.

Figure 2F:
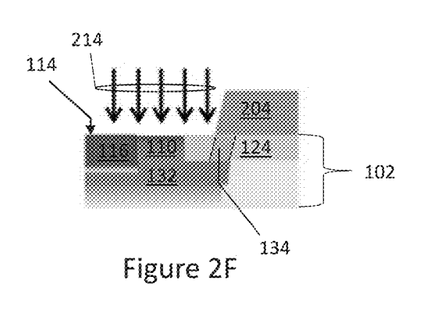

In either case, implantation 214 of dopants of the second conductivity type into the first surface 114 of the SiC substrate 102 is performed through the widened opening 206" in the mask 204 as shown in FIG. 2F or through the opening in the new mask (not shown), to define a doping profile of the buried region 132. Due to the imperfect nature of lithographic and etching processes employed in the manufacture of semiconductor devices, the mask 204 used to implant the buried (shielding) region 132 has a sloped/angled sidewall 216. The doping profile of the buried region 132 therefore includes an implantation tail 134 which extends toward the first surface 114 of the SiC substrate 102, since the mask 204 does not have full blocking capability in this region. The dopants 214 of the second conductivity type which define the doping profile of the buried region 132 are implanted at a higher dose but also at a greater energy than the dopants 200 of the first conductivity type which define the doping profile 202 of the compensation region 124, so that the dopants 200 of the first conductivity type which define the doping profile 202 of the compensation region 124 overcompensate the implantation tail 134 at the end of the channel region 112 opposite the source region 116. The tail 134 of the buried region 132 is represented by a set of dashed lines in FIG. 2F, to indicate that at least the upper part of the tail 134 closest to the first surface 114 of the SiC substrate 102 has been overcompensated by the compensation region 124.

Figure 3A:
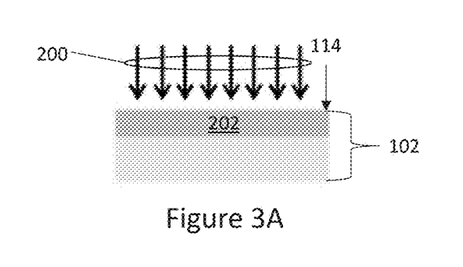
FIGS. 3A through 3F illustrate respective partial cross-sectional views of one transistor cell with the compensation region during different stages of producing the SiC device shown in FIG. 1, according to another embodiment.
Figure 3B:
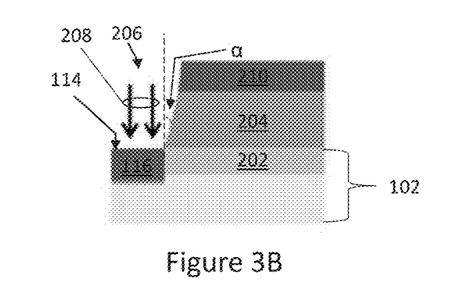
Figure 3C:
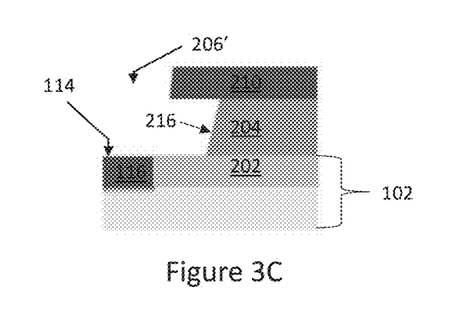

FIGS. 3A through 3F illustrate respective simplified partial cross-sectional views of one transistor cell with the compensation region 124 during different stages of producing the semiconductor device 100 shown in FIG. 1, according to another embodiment. The processing shown in FIGS. 3A through 3C corresponds to the processing shown in FIGS. 2A through 2C, respectively. Hence, no further description of FIGS. 3A through 3C is provided.

However, according to the embodiment illustrated in FIGS. 3A through 3F, the buried region 132 is formed before the body region 110.

Figure 3D:
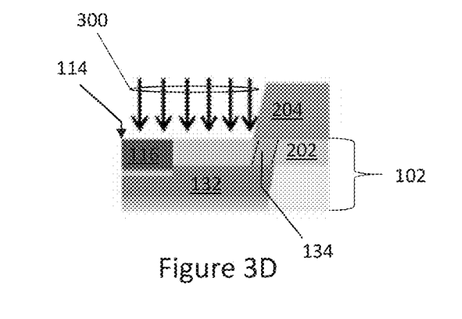
Figure 3E:
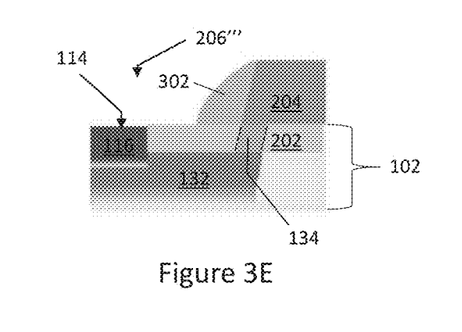

More particularly, after forming the source region 116 and before forming the body region 110, the opening 206 in the mask 204 is widened to define a location for the buried region 132 as shown in FIG. 3D. Alternatively, a new mask (not shown) with an opening that defines the location for the buried region 132 may be formed on the first surface 114 of the SiC substrate 102.

In either case, implantation 300 of dopants of the second conductivity type into the first surface 114 of the SiC substrate 102 is performed through the widened opening 206' in the mask 204 as shown in FIG. 3D or the opening in the new mask (not shown) which defines the location for the buried region 132, to define a doping profile of the buried region 132. As explained above, the mask 204 used to implant the buried (shielding) region 132 has a sloped/angled sidewall 216. Hence, the doping profile of the buried region 132 includes an implantation tail 134 which extends toward the first surface 114 of the SiC substrate 102. The dopants 300 of the second conductivity type which define the doping profile of the buried region 132 are implanted at a higher dose but also at a greater energy than the dopants 200 of the first conductivity type which define the doping profile 202 of the compensation region 124, so that the dopants 200 of the first conductivity type which define the doping profile 202 of the compensation region 124 overcompensate the implantation tail 134 at the end of the channel region 112 opposite the source region 116, thereby defining a border/edge between the compensation region 124 and the channel region 112.

After forming the buried region 132, the widened opening 206' in the mask 204 is narrowed to define a location for the body region 110. According to the embodiment illustrated in FIG. 3E, the widened opening 206' in the mask 204 is narrowed by forming a spacer 302 on the sloped/angled sidewall 216 of the widened opening 206' in the mask 204. The spacer 302 may be formed, for example, by depositing a spacer material on the SiC substrate 102 and patterning the spacer material so as to leave the spacer 302 on the sloped/angled sidewall 216 of the widened opening 206' in the mask 204. In another embodiment, a new mask with an opening that defines the location for the body region 110 may be formed on the first surface 114 of the SiC substrate 102.

Figure 3F:
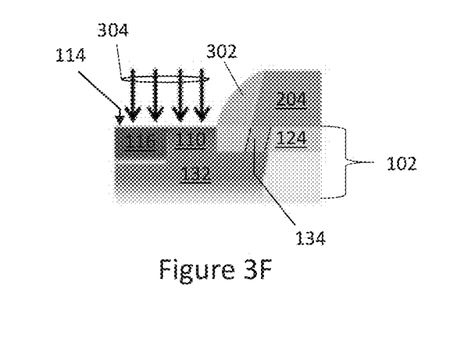

In each case, implanting 304 of dopants of the second conductivity type into the first surface 114 of the SiC substrate 102 is performed through the narrowed opening 206''' in the mask 204 as shown in FIG. 3F or the opening in the new mask (not shown) which defines the location for the body region 110, to define a doping profile of the body region 110. The dopants 304 of the second conductivity type which define the doping profile of the body region 110 are implanted at a higher dose than the dopants 200 of the first conductivity type which define the doping profile 202 of the compensation region 124, so that the dopants 304 of the second conductivity type which define the doping profile of the body region 110 overcompensate the dopants 200 of the first conductivity type in the channel region 112.

Figure 4:
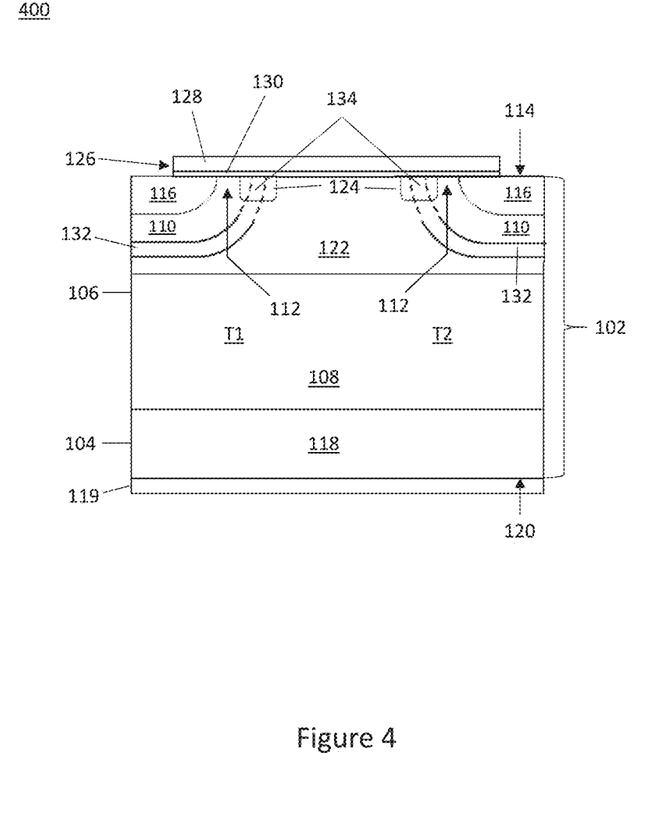
FIG. 4 illustrates a partial cross-sectional view of another embodiment of a SiC device having a buried region for shielding the gate dielectric of the device against high electric fields and a compensation region for overcompensating an implantation tail of the buried region.

FIG. 4 illustrates a partial cross-sectional view of two adjacent transistor cells T1, T2 of a semiconductor device 400. The semiconductor device 400 illustrated in FIG. 4 is similar to the semiconductor device 100 illustrated in FIG. 1. Different, however, the compensation region 124 does not extend uninterrupted along the first surface 114 of the SiC substrate 102 between the body regions 110 of the adjacent transistor cells T1, T2. Instead, each compensation region 124 is localized to the corresponding transistor cell T1, T2. According to this embodiment, a part of the extension region 122 which adjoins the first surface 114 of the SiC substrate 102 separates the compensation regions 124 of adjacent transistor cells T1, T2. The localized compensation regions 124 may be formed by a masked implantation, instead of the blanket implantation 200 shown in FIGS. 2A and 3A.

FIGS. 5A through 5G illustrate respective simplified partial cross-sectional views of one transistor cell with the localized compensation region 124 during different stages of producing the semiconductor device 400 shown in FIG. 4.

Figure 5A:
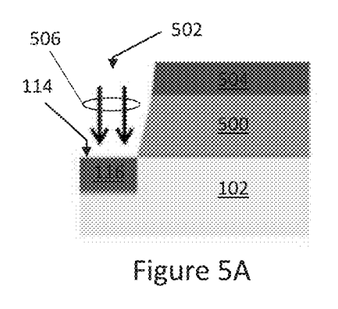
FIGS. 5A through 5G illustrate respective partial cross-sectional views of one transistor cell with the compensation region during different stages of producing the SiC device shown in FIG. 4.

In FIG. 5A, a mask 500 is formed on the first surface 114 of the SiC substrate 102. The mask 500 has an opening 502 with a first width which defines a location for the source region 116. In one embodiment, the mask 500 is an oxide hard mask and the opening 502 is etched through the oxide hard mask 500 using a polysilicon mask 504. The source region 116 is formed by implanting 506 of dopants of the first conductivity type into the first surface 114 of the SiC substrate 102 through the opening 502 in the mask 500.

Figure 5B:
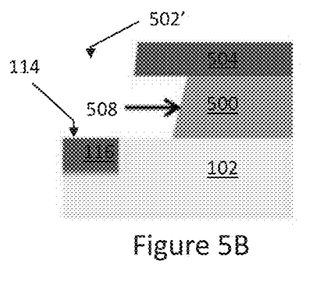

After forming the source region 116, the opening 502 in the mask 500 is widened 508 to a second width define a location for the body region 110 as shown in FIG. 5B. Alternatively, a new mask (not shown) with an opening that defines the location for the body region 110 may be formed on the first surface 114 of the SiC substrate 102.

Figure 5C:
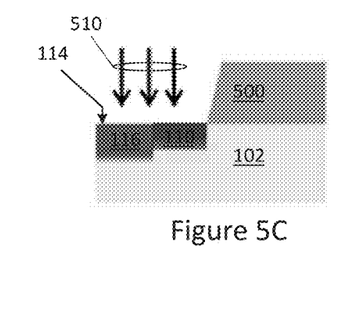

FIG. 5C shows implanting 510 of dopants of the second conductivity type into the first surface 114 of the SiC substrate 102 through the widened opening 502' in the mask or the opening in a new mask (not shown) which defines the location for the body region 110, to define a doping profile of the body region 110.

Figure 5D:
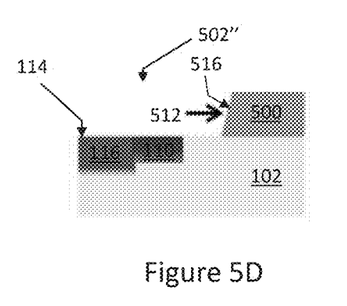

After forming the body region 110, FIG. 5D shows widening 512 the opening 502' in the mask 500 to a third width greater than the second width to define a location for the buried region 132. Alternatively, a new mask (not shown) with an opening that defines the location for the buried region 132 may be formed on the first surface 114 of the SiC substrate 102.

Figure 5E:
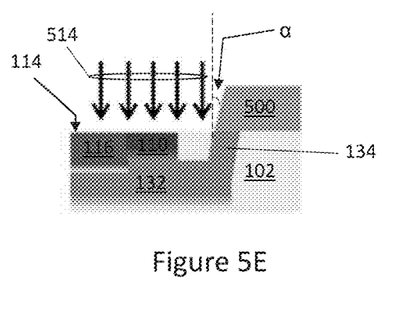

In either case, FIG. 5E shows implanting 514 dopants of the second conductivity type into the first surface 114 of the SiC substrate 102 through the widened opening 502" in the mask 500 or the opening in a new mask (not shown) which defines the location for the buried region 132, to define a doping profile of the buried region 132. As explained above, the mask 500 used to implant the buried (shielding) region 132 has a sloped/angled sidewall 516. Hence, the doping profile of the buried region 132 includes an implantation tail 134 which extends toward the first surface 114 of the SiC substrate 102 since the mask 500 does not have full blocking capability in this region.

The dopants 514 of the second conductivity type which define the doping profile of the buried region 132 are implanted at a lower dose than the dopants 506 of the first conductivity type which define the doping profile of the source region 116. The dopants 514 of the second conductivity type which define the doping profile of the buried region 132 are implanted at a greater energy than the dopants 510 of the second conductivity type which define the doping profile of the body region 110, so that the buried region 132 is formed below the body region 110 in the SiC substrate 102.

Figure 5F:
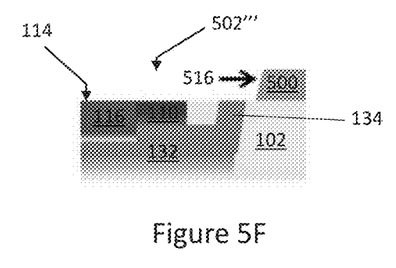

After forming the buried region 132, FIG. 5F shows widening 516 the opening 502" in the mask 500 to a fourth width greater than the third width to define a location for the compensation region 124. Alternatively, a new mask (not shown) with an opening that defines the location for the compensation region 124 may be formed on the first surface 114 of the SiC substrate 102.

Figure 5G:
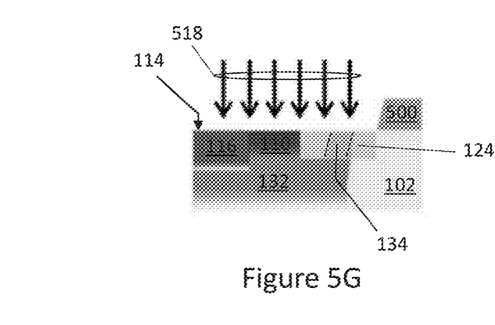

In either case, FIG. 5G shows implanting 518 dopants of the first conductivity type into the first surface 114 of the SiC substrate 102 through the widened opening 502''' in the mask 500 or through the opening in a new mask (not shown) that defines the location for the compensation region 124, to define a doping profile of the compensation region 124. According to this embodiment, a targeted implantation 518 of the first conductivity type is performed only where needed to compensate the implantation tail 134 of the buried region 132.

The dopants 518 of the first conductivity type which define the doping profile of the compensation region 124 are implanted at a lower dose and at a lower energy than the dopants 514 of the second conductivity type which define the doping profile of the buried region 132, so that the dopants 518 of the first conductivity type which define the doping profile of the compensation region 124 overcompensate the implantation tail 134 at the end of the channel region 112 opposite the source region 116. The tail 134 of the buried region 132 is represented by a set of dashed lines in FIG. 5G, to indicate that at least the upper part of the tail 134 closest to the first surface 114 of the SiC substrate 102 has been overcompensated by the compensation region 124.

Figure 6A:
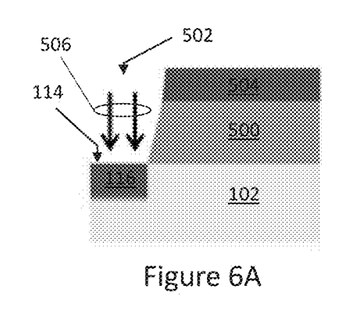
FIGS. 6A through 6F illustrate respective partial cross-sectional views of one transistor cell with the compensation region during different stages of producing the SiC device shown in FIG. 4, according to another embodiment.
Figure 6B:
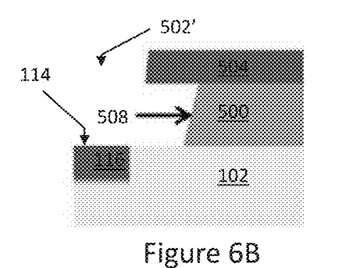

FIGS. 6A through 6F illustrate respective simplified partial cross-sectional views of one transistor cell with the compensation region 124 during different stages of producing the semiconductor device 400 shown in FIG. 4, according to another embodiment. The processing shown in FIGS. 6A and 6B corresponds to the processing shown in FIGS. 5A and 5B, respectively. Hence, no further description of FIGS. 6A and 6B is provided.

However, according to the embodiment illustrated in FIGS. 6A through 6F, the buried region 132 is formed before the body region 110.

Figure 6C:
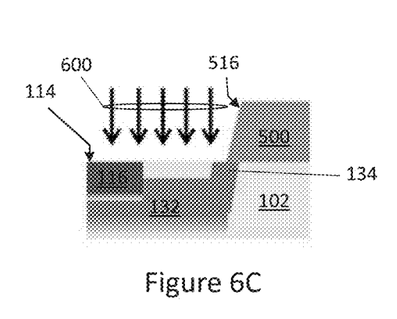

More particularly, after forming the source region 116 and widening 508 the opening 502 in the mask 500 or forming a new mask (not shown) with an opening that defines the location for the buried region 132, FIG. 6C shows implanting 600 dopants of the second conductivity type into the first surface 114 of the SiC substrate 102 through the widened opening 502' in the mask 500 or the opening in a new mask (not shown) which defines the location for the buried region 132, to define a doping profile of the buried region 132. As explained above, the mask 500 used to implant the buried (shielding) region 132 may have a sloped/angled sidewall 512. In addition or as an alternative, dopants may be implanted at a high energy and/or a higher dose. Either a mask 500 with a sloped/angled sidewall 512 or a high implantation energy or a combination of both may result in a doping profile of the buried region 132 that includes an implantation tail 134 which extends toward the first surface 114 of the SiC substrate 102.

Figure 6D:
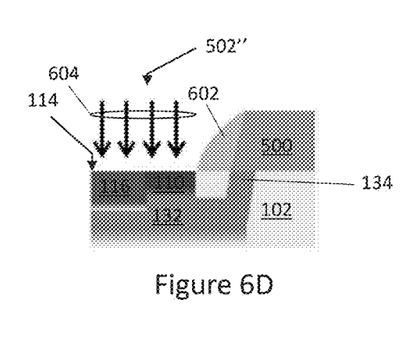

After forming the buried region 132, the widened opening 502' in the mask 500 is narrowed to a width between the width 502' used to form the buried region 132 and the width 502 used to form the source region 116 as shown in FIG. 6D, to define a location for the body region 110. According to the embodiment illustrated in FIG. 6D, the widened opening 502' in the mask 500 used to form the buried region 132 is narrowed by forming a spacer 602 on the sloped/angled sidewall 516 of the widened opening 502' in the mask 500. The spacer 602 may be formed, for example, by depositing a spacer material on the SiC substrate 102 and patterning the spacer material so as to leave the spacer 602 on the sloped/angled sidewall 516 of the widened opening 502' in the mask 500. In another embodiment, a new mask with an opening that defines the location for the body region 110 may be formed on the first surface 114 of the SiC substrate 102.

FIG. 6D also shows implanting 604 dopants of the second conductivity type into the first surface 114 of the SiC substrate 102 through the narrowed opening 502" in the mask 500 or the opening in a new mask (not shown) which defines the location for the body region 110, to define a doping profile of the body region 110. The dopants 604 of the second conductivity type which define the doping profile of the body region 110 are implanted at a lower dose than the dopants 506 of the first conductivity type which define the doping profile of the source region 116. The dopants 600 of the second conductivity type which defined the doping profile of the buried region 132 were implanted at a greater energy than the dopants 604 of the second conductivity type which define the doping profile of the body region 110, so that the buried region 132 is formed below the body region 110 in the SiC substrate 102.

Figure 6E:
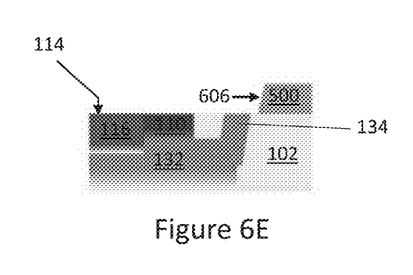

After forming the body region 110, FIG. 6E shows widening 606 the opening 502" in the mask 500 to a width greater than the width 502' used to form the buried region 132. If a spacer 602 was previously used to narrow the opening 502' in the mask 500 to form the body region 110, the spacer 602 is removed as part of the mask widening process. Alternatively, a new mask (not shown) with an opening that defines the location for the compensation region 124 may be formed on the first surface 114 of the SiC substrate 102.

Figure 6F:
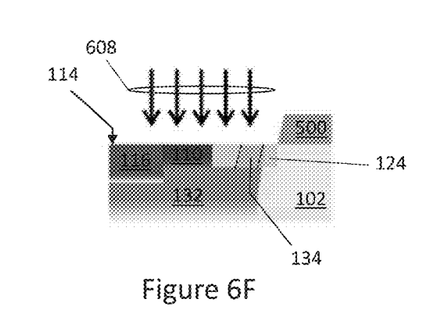

In either case, FIG. 6F shows implanting 608 dopants of the first conductivity type into the first surface 114 of the SiC substrate 102 through the widened opening 502''' in the mask 500 or through the opening in a new mask (not shown) which defines the location for the compensation region 124, to define a doping profile of the compensation region 124. The dopants 608 of the first conductivity type which define the doping profile of the compensation region 124 are implanted at a lower dose and at a lower energy than the dopants 600 of the second conductivity type which define the doping profile of the buried region 132, so that the dopants 608 of the first conductivity type which define the doping profile of the compensation region 124 overcompensate the implantation tail 134 at the end of the channel region 112 opposite the source region 116.

The embodiments illustrated in FIGS. 5A-5G and 6A-6F avoid implanting the dopants used to form the compensation region 124 into the extension region 122, thereby lower the electric field in the gate dielectric 128 compared to the blanket implantation process used to form the compensation region 124 in FIGS. 2A-2F and 3A-3F. The embodiments illustrated in FIGS. 2A-2F and 3A-3F are simpler to implement, since a blanket implantation instead of a targeted implantation is used to form the compensation region 124.

Each of the method embodiments described above and illustrated in FIGS. 2A-2F, 3A-3F, 5A-5G and 6A-6F yield a SiC that includes: a drift region 108 of a first conductivity type; a body region 110 of a second conductivity type above the drift region 108 and having a channel region 112; a source region 116 of the first conductivity type in the body region 110 and adjoining a first end of the channel region 112; a buried region 132 of the second conductivity type below the body region 110 and having a tail 134 which extends upward toward the channel region 112; and a compensation region 124 of the first conductivity type adjoining a second end of the channel region 112 opposite the first end, wherein the buried region 132 extends under the compensation region 124, and wherein an average doping concentration of the compensation region 124 is greater than an average doping concentration of the tail 134 of the buried region 132, so that the compensation region 124 overcompensates the tail 134 of the buried region 132 and separates the tail 134 from the second end of the channel region 112.

Although the present disclosure is not so limited, the following numbered examples demonstrate one or more aspects of the disclosure.

Example 1. A semiconductor device, comprising: a silicon carbide (SiC) substrate which comprises: a drift region of a first conductivity type; a body region of a second conductivity type above the drift region and having a channel region which adjoins a first surface of the SiC substrate; a source region of the first conductivity type in the body region and adjoining a first end of the channel region; an extension region of the first conductivity type at an opposite side of the body region as the source region and vertically extending to the drift region; a buried region of the second conductivity type below the body region and having a tail which extends toward the first surface and adjoins the extension region; and a compensation region of the first conductivity type protruding from the extension region into the body region along the first surface and terminating at a second end of the channel region opposite the first end, the compensation region overcompensating the tail of the buried region so that the tail is separated from the second end of the channel region.

Example 2. The semiconductor device of example 1, wherein the compensation region has a shallower average depth in the SiC substrate than both the source region and the body region as measured from the first surface.

Example 3. The semiconductor device of examples 1 or 2, wherein the compensation region is doped more heavily than the extension region.

Example 4. The semiconductor device of any one of examples 1 through 3, wherein the semiconductor device further comprises an insulated gate on the first surface and configured to control a conducting state of the channel region, wherein the compensation region laterally extends further along the insulated gate toward the source region than the extension region.

Example 5. The semiconductor device of any one of examples 1 through 4, wherein the semiconductor device further comprises a drain region of the first conductivity type below the drift region and adjoining a second surface of the SiC substrate opposite the first surface.

Example 6. A method of producing a semiconductor device, the method comprising: forming a drift region of a first conductivity type in a silicon carbide (SiC) substrate; forming a body region of a second conductivity type above the drift region and having a channel region which adjoins a first surface of the SiC substrate; forming a source region of the first conductivity type in the body region and adjoining a first end of the channel region; forming an extension region of the first conductivity type at an opposite side of the body region as the source region and vertically extending to the drift region; forming a buried region of the second conductivity type below the body region, the buried region having a tail which extends toward the first surface and adjoins the extension region; and forming a compensation region of the first conductivity type protruding from the extension region into the body region along the first surface and terminating at a second end of the channel region opposite the first end, the compensation region overcompensating the tail of the buried region so that the tail is separated from the second end of the channel region.

Example 7. The method of example 6, wherein forming the compensation region comprises blanket implanting dopants of the first conductivity type into the first surface of the SiC substrate to define a doping profile of the compensation region, the doping profile having an average doping concentration greater than an average doping concentration of the tail of the buried region.

Example 8. The method of example 7, wherein forming the buried region comprises: after the blanket implanting, forming a mask on the first surface of the SiC substrate, the mask having an opening which defines a location for the source region; after forming the source region, widening the opening in the mask or forming a new mask with an opening to define a location for the body region; and after forming the body region, further widening the opening in the mask or forming a new mask with an opening to define a location for the buried region and then implanting dopants of the second conductivity type into the first surface of the SiC substrate through the opening in the mask or new mask which defines the location for the buried region, to define a doping profile of the buried region, the doping profile of the buried region including an implantation tail which corresponds to the tail of the buried region, wherein the dopants of the second conductivity type which define the doping profile of the buried region are implanted at a higher dose and at a greater energy than the dopants of the first conductivity type which define the doping profile of the compensation region, so that the dopants of the first conductivity type which define the doping profile of the compensation region overcompensate the implantation tail at the second end of the channel region.

Example 9. The method of example 7, wherein forming the buried region comprises: after the blanket implanting, forming a mask on the first surface of the SiC substrate, the mask having an opening which defines a location for the source region; after forming the source region, widening the opening in the mask or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface, wherein the dopants of the second conductivity type which define the doping profile of the buried region are implanted at a higher dose and at a greater energy than the dopants of the first conductivity type which define the doping profile of the compensation region, so that the dopants of the first conductivity type which define the doping profile of the compensation region overcompensate the implantation tail at the second end of the channel region.

Example 10. The method of example 9, wherein forming the body region comprises: after forming the buried region, narrowing the widened opening in the mask or forming a new mask with an opening to define a location for the body region; and implanting dopants of the second conductivity type into the first surface of the SiC substrate through the opening in the mask or new mask which defines the location for the body region, to define a doping profile of the body region, wherein the dopants of the second conductivity type which define the doping profile of the body region are implanted at a higher dose than the dopants of the first conductivity type which define the doping profile of the compensation region, so that the dopants of the second conductivity type which define the doping profile of the body region overcompensate the dopants of the first conductivity type in the channel region.

Example 11. The method of example 10, wherein narrowing the widened opening in the mask comprises forming a spacer on a sidewall of the widened opening in the mask.

Example 12. The method of example 6, wherein forming the source region comprises: forming a mask on the first surface of the SiC substrate, the mask having an opening with a first width which defines a location for the source region; and implanting dopants of the first conductivity type into the first surface of the SiC substrate through the opening in the mask to define a doping profile of the source region.

Example 13. The method of example 12, wherein forming the body region comprises: after forming the source region, widening the opening in the mask to a second width greater than the first width or forming a new mask with an opening to define a location for the body region; and implanting dopants of the second conductivity type into the first surface of the SiC substrate through the opening in the mask or new mask which defines the location for the body region, to define a doping profile of the body region.

Example 14. The method of example 13, wherein forming the buried region comprises: after forming the body region, widening the opening in the mask to a third width greater than the second width or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface, wherein the dopants of the second conductivity type which define the doping profile of the buried region are implanted at a lower dose than the dopants of the first conductivity type which define the doping profile of the source region, wherein the dopants of the second conductivity type which define the doping profile of the buried region are implanted at a greater energy than the dopants of the second conductivity type which define the doping profile of the body region, so that the buried region is formed below the body region.

Example 15. The method of example 14, wherein forming the compensation region comprises: after forming the buried region, implanting dopants of the first conductivity type into the first surface of the SiC substrate through the opening in the mask having the third width or a new mask having an opening that defines a location for the compensation region, to define a doping profile of the compensation region, wherein the dopants of the first conductivity type which define the doping profile of the compensation region are implanted at a lower dose and at a lower energy than the dopants of the second conductivity type which define the doping profile of the buried region, so that the dopants of the first conductivity type which define the doping profile of the compensation region overcompensate the implantation tail at the second end of the channel region.

Example 16. The method of example 12, wherein forming the buried region comprises: after forming the source region, widening the opening in the mask to a second width greater than the first width or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface.

Example 17. The method of example 16, wherein forming the body region comprises: after forming the buried region, narrowing the opening in the mask to a third width between the second width and the first width or forming a new mask with an opening to define a location for the body region; and implanting dopants of the second conductivity type into the first surface of the SiC substrate through the opening in the mask or new mask which defines the location for the body region, to define a doping profile of the body region, wherein the dopants of the second conductivity type which define the doping profile of the body region are implanted at a lower dose than the dopants of the first conductivity type which define the doping profile of the source region, wherein the dopants of the second conductivity type which define the doping profile of the buried region are implanted at a greater energy than the dopants of the second conductivity type which define the doping profile of the body region, so that the buried region is formed below the body region.

Example 18. The method of example 17, wherein narrowing the opening in the mask to the third width comprises forming a spacer on a sidewall of the opening in the mask having the second width.

Example 19. The method of examples 17 or 18, wherein forming the compensation region comprises: after forming the body region, widening the opening in the mask to a fourth width greater than the third width or forming a new mask with an opening to define a location for the compensation region; and implanting dopants of the first conductivity type into the first surface of the SiC substrate through the opening in the mask or new mask which defines the location for the compensation region, to define a doping profile of the compensation region, wherein the dopants of the first conductivity type which define the doping profile of the compensation region are implanted at a lower dose and at a lower energy than the dopants of the second conductivity type which define the doping profile of the buried region, so that the dopants of the first conductivity type which define the doping profile of the compensation region overcompensate the implantation tail at the second end of the channel region.

Example 20. A silicon carbide (SiC) device, comprising: a drift region of a first conductivity type; a body region of a second conductivity type above the drift region and having a channel region; a source region of the first conductivity type in the body region and adjoining a first end of the channel region; a buried region of the second conductivity type below the body region and having a tail which extends upward toward the channel region; and a compensation region of the first conductivity type adjoining a second end of the channel region opposite the first end, wherein the buried region extends under the compensation region, wherein an average doping concentration of the compensation region is greater than an average doping concentration of the tail of the buried region, so that the compensation region overcompensates the tail of the buried region and separates the tail from the second end of the channel region.

Example 21. A semiconductor device, comprising a silicon carbide (SiC) substrate which comprises: a drift region of a first conductivity type; a body region of a second conductivity type above the drift region and having a channel region which adjoins a first surface of the SiC substrate; a source region of the first conductivity type in the body region and adjoining a first end of the channel region; an extension region of the first conductivity type at an opposite side of the body region as the source region and vertically extending to the drift region; a buried region of the second conductivity type below the body region; and a compensation region of the first conductivity type protruding from the extension region into the body region along the first surface and terminating at a second end of the channel region opposite the first end.

Example 22. A semiconductor device, comprising a silicon carbide (SiC) substrate which comprises: a drift region of a first conductivity type; a body region of a second conductivity type above the drift region and having a channel region which adjoins a first surface of the SiC substrate; a source region of the first conductivity type in the body region and adjoining a first end of the channel region; an extension region of the first conductivity type at an opposite side of the body region as the source region and vertically extending to the drift region; a buried region of the second conductivity type below the body region; and a compensation region of the first conductivity type at least partially surrounded by the body region at a second end of the channel region opposite the first end and at least partially surrounded or overlapped by the extension region at a bottom of the compensation region.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a silicon carbide (SiC) substrate comprising:
        a drift region of a first conductivity type;
        a body region of a second conductivity type above the drift region and having a channel region which adjoins a first surface of the SiC substrate;
        a source region of the first conductivity type in the body region and adjoining a first end of the channel region;
        an extension region of the first conductivity type at an opposite side of the body region as the source region and vertically extending to the drift region;
        a buried region of the second conductivity type below the body region and having a tail which extends toward the first surface and adjoins the extension region; and
        a compensation region of the first conductivity type protruding from the extension region into the body region along the first surface and terminating at a second end of the channel region opposite the first end, the compensation region overcompensating the tail of the buried region so that the tail is separated from the second end of the channel region.

2. The semiconductor device of claim 1, wherein the compensation region has a shallower average depth in the SiC substrate than both the source region and the body region as measured from the first surface.

3. The semiconductor device of claim 1, wherein the compensation region is doped more heavily than the extension region in a non-overlapping part of the compensation and extension regions.

4. The semiconductor device of claim 1, further comprising an insulated gate on the first surface and configured to control a conducting state of the channel region, wherein the compensation region laterally extends further along the insulated gate toward the source region than the extension region.

5. The semiconductor device of claim 1, further comprising a drain region of the first conductivity type below the drift region and adjoining a second surface of the SiC substrate opposite the first surface.

6. A method of producing a semiconductor device, the method comprising:
    forming a drift region of a first conductivity type in a silicon carbide (SiC) substrate;
    forming a body region of a second conductivity type above the drift region and having a channel region which adjoins a first surface of the SiC substrate;

forming a source region of the first conductivity type in the body region and adjoining a first end of the channel region;

forming an extension region of the first conductivity type at an opposite side of the body region as the source region and vertically extending to the drift region;

forming a buried region of the second conductivity type below the body region, the buried region having a tail which extends toward the first surface and adjoins the extension region; and forming a compensation region of the first conductivity type protruding from the extension region into the body region along the first surface and terminating at a second end of the channel region opposite the first end, the compensation region overcompensating the tail of the buried region so that the tail is separated from the second end of the channel region.

7. The method of claim 6, wherein forming the compensation region comprises:

blanket implanting dopants of the first conductivity type into the first surface of the SiC substrate to define a doping profile of the compensation region, the doping profile having an average doping concentration greater than an average doping concentration of the tail of the buried region.

8. The method of claim 7, wherein forming the buried region comprises:

after the blanket implanting, forming a mask on the first surface of the SiC substrate, the mask having an opening which defines a location for the source region;

after forming the source region, widening the opening in the mask or forming a new mask with an opening to define a location for the body region; and after forming the body region, further widening the opening in the mask or forming a new mask with an opening to define a location for the buried region and then implanting dopants of the second conductivity type into the first surface of the SiC substrate through the opening in the mask or new mask which defines the location for the buried region, to define a doping profile of the buried region, the doping profile of the buried region including an implantation tail which corresponds to the tail of the buried region, wherein the dopants of the second conductivity type which define the doping profile of the buried region are implanted at a higher dose and at a greater energy than the dopants of the first conductivity type which define the doping profile of the compensation region, so that the dopants of the first conductivity type which define the doping profile of the compensation region overcompensate the implantation tail at the second end of the channel region.

9. The method of claim 7, wherein forming the buried region comprises:

after the blanket implanting, forming a mask on the first surface of the SiC substrate, the mask having an opening which defines a location for the source region;

after forming the source region, widening the opening in the mask or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface, wherein the dopants of the second conductivity type which define the doping profile of the buried region are implanted at a higher dose and at a greater energy than the dopants of the first conductivity type which define the doping profile of the compensation region, so that the dopants of the first conductivity type which define the doping profile of the compensation region overcompensate the implantation tail at the second end of the channel region.

10. The method of claim 9, wherein forming the body region comprises:

after forming the buried region, narrowing the widened opening in the mask or forming a new mask with an opening to define a location for the body region; and implanting dopants of the second conductivity type into the first surface of the SiC substrate through the opening in the mask or new mask which defines the location for the body region, to define a doping profile of the body region, wherein the dopants of the second conductivity type which define the doping profile of the body region are implanted at a higher dose than the dopants of the first conductivity type which define the doping profile of the compensation region, so that the dopants of the second conductivity type which define the doping profile of the body region overcompensate the dopants of the first conductivity type in the channel region.

11. The method of claim 10, wherein narrowing the widened opening in the mask comprises:

forming a spacer on a sidewall of the widened opening in the mask.

12. The method of claim 6, wherein forming the source region comprises:

forming a mask on the first surface of the SiC substrate, the mask having an opening with a first width which defines a location for the source region; and implanting dopants of the first conductivity type into the first surface of the SiC substrate through the opening in the mask to define a doping profile of the source region.

13. The method of claim 12, wherein forming the body region comprises:

after forming the source region, widening the opening in the mask to a second width greater than the first width or forming a new mask with an opening to define a location for the body region; and implanting dopants of the second conductivity type into the first surface of the SiC substrate through the opening in the mask or new mask which defines the location for the body region, to define a doping profile of the body region.

14. The method of claim 13, wherein forming the buried region comprises:

after forming the body region, widening the opening in the mask to a third width greater than the second width or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface, wherein the dopants of the second conductivity type which define the doping profile of the buried region are implanted at a lower dose than the dopants of the first conductivity type which define the doping profile of the source region, wherein the dopants of the second conductivity type which define the doping profile of the buried region are implanted at a greater energy than the dopants of the second conductivity type which define the doping profile of the body region, so that the buried region is formed below the body region.

15. The method of claim 14, wherein forming the compensation region comprises:

after forming the buried region, implanting dopants of the first conductivity type into the first surface of the SiC substrate through the opening in the mask having the third width or a new mask having an opening that defines a location for the compensation region, to define a doping profile of the compensation region, wherein the dopants of the first conductivity type which define the doping profile of the compensation region are implanted at a lower dose and at a lower energy than the dopants of the second conductivity type which define the doping profile of the buried region, so that the dopants of the first conductivity type which define the doping profile of the compensation region overcompensate the implantation tail at the second end of the channel region.

16. The method of claim 12, wherein forming the buried region comprises:

after forming the source region, widening the opening in the mask to a second width greater than the first width or forming a new mask with an opening to define a location for the buried region; and implanting dopants of the second conductivity type into the first surface of the SiC substrate through the opening in the mask or new mask which defines the location for the buried region, to define a doping profile of the buried region, the doping profile of the buried region including an implantation tail which extends toward the first surface.

17. The method of claim 16, wherein forming the body region comprises:

after forming the buried region, narrowing the opening in the mask to a third width between the second width and the first width or forming a new mask with an opening to define a location for the body region; and implanting dopants of the second conductivity type into the first surface of the SiC substrate through the opening in the mask or new mask which defines the location for the body region, to define a doping profile of the body region, wherein the dopants of the second conductivity type which define the doping profile of the body region are implanted at a lower dose than the dopants of the first conductivity type which define the doping profile of the source region, wherein the dopants of the second conductivity type which define the doping profile of the buried region are implanted at a greater energy than the dopants of the second conductivity type which define the doping profile of the body region, so that the buried region is formed below the body region.

18. The method of claim 17, wherein narrowing the opening in the mask to the third width comprises:

forming a spacer on a sidewall of the opening in the mask having the second width.

19. The method of claim 17, wherein forming the compensation region comprises:

after forming the body region, widening the opening in the mask to a fourth width greater than the third width or forming a new mask with an opening to define a location for the compensation region; and implanting dopants of the first conductivity type into the first surface of the SiC substrate through the opening in the mask or new mask which defines the location for the compensation region, to define a doping profile of the compensation region, wherein the dopants of the first conductivity type which define the doping profile of the compensation region are implanted at a lower dose and at a lower energy than the dopants of the second conductivity type which define the doping profile of the buried region, so that the dopants of the first conductivity type which define the doping profile of the compensation region overcompensate the implantation tail at the second end of the channel region.

20. A silicon carbide (SiC) device, comprising:

a drift region of a first conductivity type;

a body region of a second conductivity type above the drift region and having a channel region;

a source region of the first conductivity type in the body region and adjoining a first end of the channel region;

a buried region of the second conductivity type below the body region and having a tail which extends upward toward the channel region; and a compensation region of the first conductivity type adjoining a second end of the channel region opposite the first end, wherein the buried region extends under the compensation region, wherein an average doping concentration of the compensation region is greater than an average doping concentration of the tail of the buried region, so that the compensation region overcompensates the tail of the buried region and separates the tail from the second end of the channel region.

* * * * *